US010611078B2

(12) United States Patent
Luursema et al.

(10) Patent No.: US 10,611,078 B2
(45) Date of Patent: Apr. 7, 2020

(54) METHOD AND APPARATUS FOR APPLYING A LAYER HAVING A RELIEF ON A FLAT FACE OF A SUBSTRATE

(71) Applicant: IAI Industrial systems B.V., Veldhoven (NL)

(72) Inventors: Erik Luursema, Veldhoven (NL); Jurgen Kremer, Breda (NL)

(73) Assignee: IAI IndustriaL systems B.V., Veldhoven (NL)

( * ) Notice: Subject to any disclaimer, the term of this patent is extended or adjusted under 35 U.S.C. 154(b) by 324 days.

(21) Appl. No.: 15/485,810

(22) Filed: Apr. 12, 2017

(65) Prior Publication Data
US 2017/0291350 A1    Oct. 12, 2017

(30) Foreign Application Priority Data

Apr. 12, 2016  (NL) ..................................... 2016593
Apr. 12, 2017  (EP) ..................................... 17166251

(51) Int. Cl.
*B29C 59/02*    (2006.01)
*G03F 7/00*    (2006.01)
(Continued)

(52) U.S. Cl.
CPC ........ *B29C 59/026* (2013.01); *B29C 35/0805* (2013.01); *B29C 59/002* (2013.01);
(Continued)

(58) Field of Classification Search
None
See application file for complete search history.

(56) References Cited

U.S. PATENT DOCUMENTS 4,312,823 A * 1/1982 Kraakman .......... B29C 35/0888
                                                      264/107
5,500,067 A * 3/1996 Jenkner ................ A43B 13/187
                                                      156/145
(Continued)

FOREIGN PATENT DOCUMENTS

EP    3 235 626 A1    10/2017

OTHER PUBLICATIONS

Extended European Search Report for corresponding European Patent Application No. 17166251.3, dated Sep. 21, 2017.
"European Application Serial No. 17166251.3, Response filed Apr. 14, 2018 to Extended European Search Report dated Sep. 21, 2017", 14 pgs.

*Primary Examiner* — Jacob T Minskey
*Assistant Examiner* — Baileigh Kate Darnell
(74) *Attorney, Agent, or Firm* — Schwegman Lundberg & Woessner, P.A.

(57) ABSTRACT

A method for applying a layer having a relief on a substrate includes steps of securing the substrate, applying a layer of a curable liquid on the substrate, bringing a mould having a relief being the negative of the relief to be provided on the substrate, into contact with a part of the upper surface of the liquid layer, curing the liquid layer while the mould is in contact with the liquid and separating the mould from the substrate. Initially the mould is brought into contact with the liquid in a bent position while the substrate is kept flat and subsequently the mould is brought into contact over an increasing surface area keeping the mould in a bent position until the complete liquid layer is in contact with the mould.

20 Claims, 6 Drawing Sheets

(51) Int. Cl.
*B32B 37/00* (2006.01)
*B32B 38/06* (2006.01)
*B29C 35/08* (2006.01)
*B29C 59/00* (2006.01)
B32B 38/00 (2006.01)
B32B 37/24 (2006.01)
B29K 105/00 (2006.01)

(52) U.S. Cl.
CPC .......... *B29C 59/022* (2013.01); *B32B 37/003* (2013.01); *B32B 37/0046* (2013.01); *B32B 38/06* (2013.01); *G03F 7/00* (2013.01); *B29C 2059/023* (2013.01); *B29K 2105/0058* (2013.01); *B29K 2995/0027* (2013.01); *B29K 2995/0046* (2013.01); *B32B 2037/243* (2013.01); *B32B 2038/0076* (2013.01); *B32B 2425/00* (2013.01)

(56) References Cited

U.S. PATENT DOCUMENTS

| | | | |
|---|---|---|---|
| 5,804,017 A * | 9/1998 | Hector | B29C 35/0888 156/242 |
| 8,163,222 B2 | 4/2012 | Done et al. | |
| 2006/0065989 A1* | 3/2006 | Druffel | B29C 35/0805 264/1.32 |
| 2007/0114686 A1* | 5/2007 | Choi | B29C 43/003 264/2.7 |
| 2007/0228589 A1* | 10/2007 | Choi | B82Y 10/00 264/39 |
| 2010/0154987 A1* | 6/2010 | Vontell, Sr. | B25B 1/2405 156/273.7 |
| 2010/0255139 A1 | 10/2010 | Washiya et al. | |
| 2010/0303947 A1 | 12/2010 | Mori et al. | |
| 2015/0021798 A1 | 1/2015 | Kimura et al. | |

* cited by examiner

METHOD AND APPARATUS FOR APPLYING A LAYER HAVING A RELIEF ON A FLAT FACE OF A SUBSTRATE

CROSS-REFERENCE TO RELATED APPLICATION

This Application claims the benefit of European Application No. EP 17 166251.3, filed Apr. 12, 2017, and Netherlands Application No. NL 2016593, filed Apr. 12, 2016; the contents of which are hereby incorporated by reference in their entirety.

FIELD

The present invention relates to a method for applying a layer having a relief on a flat face of a substrate.

BACKGROUND

In some situations there is a desire to provide a layer with a relief on a substrate. This may be the case in the provision of a frosted layer on clear glass or the provision of optical structures on printed matter to obtain visual effects. Although voluminous substrates are not excluded, it is envisaged that the layer having a relief is applied on a thin substrate, such as a card or a piece of paper. The substrate may be laminated but it may also be formed by a single layer. The substrate is preferably, but not necessarily formed by a security document such as an identity card, a personalized card in a passport or a credit card.

From the prior art a method is known, comprising the steps of securing the substrate with the surface onto which the relief is to be provided on top, applying a layer of a curable liquid on the upper surface of the substrate, bringing a mould having a counter relief into contact with at least a part of the upper surface of the liquid layer, curing the liquid layer while the mould is in contact with the curable liquid and separating the mould from the substrate.

This prior art method makes use of a rigid mould. This leads to the disadvantage that when the mould is brought into contact with the liquid on the substrate, air inclusions may develop, leading to bubbles in the liquid and to later to irregularities in the relief after curing. Further there the liquid may be pushed away from the substrate by the mould.

To avoid these disadvantages, another prior art method provides a method of the kind referred above wherein the mould is still rigid, but wherein the substrate is bent. Although possible if the substrate can be bended, this method has the disadvantage that, after making contact with the mould, the substrate must be brought back to its original flat shape before the curing can take place, requiring complicated machinery and likely leading to deformation of the relief. The substrate can be brought back to its original flat shape after curing, but this would lead to deformation and breakage of the relief layer.

The present invention aims to avoid these disadvantages, by providing such a method wherein initially the mould is brought into contact with the upper surface of the liquid layer in bent position while the substrate is kept flat and subsequently the mould is brought into contact with an increasing surface area, keeping the mould in a bent position until the complete liquid layer is in contact with the mould and at least the part of the mould in contact with the liquid layer being flat, keeping the substrate flat. The bent mould is kept in a form wherein the profile of the mould is a catenary. Upon contact of the mould with the surface, the profile of the mould is kept to be the same catenary. This is achieved by moving the ends of the mould which are guided by a manipulator not only in a vertical direction but also in a horizontal direction in such a way that the mould not being in contact with the surface of the liquid layer has the profile of the same catenary than before. By this guidance, the profile of the mould not being in contact with the surface can be kept as the same catenary over the whole process of bringing the mould into contact with the surface. At the end, the whole mould is in contact with the surface and after that there is no catenary profile but the mould is horizontal to the surface.

A catenary is the curve that an idealized hanging chain or cable assumes under its own weight when supported only at its ends. The curve has a U-like shape, superficially similar in appearance to a parabola, but it is not a parabola: it is a (scaled, rotated) graph of the hyperbolic cosine. Before the mould is in contact with the surface, it has a profile of a catenary. During the lowering process on the surface, this profile is kept by moving the ends of the mould along a curve that constrains the remaining profile of the mould not being in contact with the surface to that catenary of the free hanging mould with no contact with the surface. In practice, this might not be achieved mathematically precisely, but the method follows this theoretical curve approximately.

This method provides the gradual bringing into contact of the mould with the fluid layer on the substrate, avoiding any air inclusions. Further it avoids the urging of the liquid away from the substrate, as the process is gradual. Finally it avoids deformation of the relief layer either in liquid or in cured form with the associated problems.

If the substrate is a security document, the substrate is provided with a print, often with a personalized section. The relief layer needs to be transparent for visible light to allow the print of the substrate to be viewed. For further enhancement of the security it is preferred that the relief layer itself is also provided with a print. This extra print on the relief layer may cooperate with the print under the relief layer to give a visible effect, possibly in cooperation with the relief layer. The relief layer may have properties leading to a visible effect such as a lenticular effect. All these features enhance the security, that is, increase the difficulty of copying and falsification.

It is noted that in the above paragraph the mould is brought to the substrate; it will be clear that it is also possible to move the substrate to mould or to move both the substrate and the mould to each other. Any amendments to the apparatus required to perform these kinematic variations will be clear for a skilled man.

Further the present invention provides an apparatus for applying a layer having a relief on a flat surface of a substrate, the apparatus comprising a frame, securing means connected to the frame and adapted to secure the substrate with the surface of the substrate onto which the relief is to be applied, on top, a flat mould carrying a counter relief, a radiation source adapted to emit radiation curing the liquid applied in a layer on the substrate to a solid layer having a relief, wherein the mould is flexible and that the flexible mould has a profile of a catenary before being brought in contact with the upper surface of the liquid layer and the apparatus comprises a manipulator connected to the frame, the manipulator being adapted to initially bring the mould into contact with the upper surface of the liquid layer and to subsequently bring the mould into contact over an adjacent upper surface area of the liquid layer until the complete liquid layer is in contact with the mould wherein the mould is kept bent until the complete liquid layer is in contact with the mould and at least the part of the mould in contact with the liquid layer is flat, wherein the manipulator is adapted to guide the mould such that the profile of the mould not being in contact with the surface is kept as the same catenary over the whole process of bringing the mould into contact with the surface. With this guidance of the manipulators along a curve which is not only vertically moving downwards but at the same time moving horizontally outwards to a degree that the profile of the mould can be kept to follow the same catenary, constant conditions at the line of contact between the mould and the surface can be achieved.

For most mould materials, such as silicone, the flexibility of the mould allows bending of the mould over a single axis only. Assuming the axis of the bent of the mould to be parallel to the upper surface of the substrate, the mould is initially brought into contact with the substrate over a line.

However it is also possible that the mould is initially brought into contact with the substrate in a point. This requires the axis of the bend of the mould being tilted relative to the surface of the substrate during initial contact. Having such a tilted axis of bending prevents later contact of the mould over the complete surface of the substrate with the flat mould. To make contact over the full surface area of the substrate, the mould needs to be moved to a position with its axis of bending parallel to the surface of the substrate.

This embodiment also provides an apparatus wherein the clamps are connected to the yoke rotatably over an axis extending substantially between the centres of the clamps.

SUMMARY

According to an embodiment, the initial contact location coincides with one side of the upper surface of the substrate and that subsequently the mould is brought into contact with the further upper surface area of the liquid layer in a single direction. Herein the complete surface of the liquid must be covered in a single process, but which requires complicated manipulation equipment and which requires some time.

It is, however, preferred that the initial contact location is on a distance from the sides of the upper surface of the substrate and that subsequently the mould is brought into contact with the further surface area of the liquid layer in two opposite directions. In this process the two areas at either side of the initial contact are covered simultaneously, hence requiring less time. Further the process is preferably executed symmetrically, making the manipulator relatively simple as the flexible mould can be gripped at its ends, allowing the mould to sag so that the lowest part of the mould contacts the liquid initially.

According to another preferred embodiment the liquid layer applied is transparent for curing radiation when liquid and transparent for visible light when cured. The transparency in the liquid state allows to reach the complete layer with the radiation. Although it is possible to make the resulting cured layer opaque and coloured, it is preferred that the cured layer is transparent for visible light. This allows to provide optical features in the transparent layer such as small lenses etc.

The same feature provides an apparatus of the kind referred to above, wherein the mould is transparent for radiation emitted by the radiation source. Further it is noted that it is also possible to irradiate the liquid layer from the underside that is through the substrate. It will be clear that this would require the transparency of the substrate for the radiation curing the liquid.

As explained earlier the most attractive way of bringing the mould into contact with the liquid, is to make contact between the mould and the liquid in an intermediate position and to gradually increase the surface area of the contact in both directions. This is made easier when the manipulator comprises two clamps, each being adapted to grip one of two opposite sides of the mould and each being connected with a yoke moveable in a vertical direction and comprising driving means for driving the vertical movement of the yoke. Then the distance between the clamps is smaller than the length of the mould so that the mould sags and the lowest part of the mould contacts the liquid first and the contact face is increased when the clamps are lowered further.

To allow sagging of the mould, it is preferred when at least one of the clamps is mounted on the yoke rotatable around an axis extending parallel to the contact line and that the apparatus comprises rotation coupling means adapted to couple the rotation movement of the at least one clamp relative to the yoke to the vertical movement of the yoke. This feature allows to have the mould extend downwardly sloping from the clamps, wherein the slope may change during the lowering of the mould as caused by the movement of the separation between the increasing part of the mould in contact with the liquid and the decreasing part of the mould, not in contact with the liquid.

For the same reason it is preferred when at least one of the clamps is mounted on the yoke translatable in horizontal direction and the apparatus comprises coupling means adapted to couple the horizontal movement of the at least one clamp relative to the yoke.

The same effect is reached when the clamps are symmetrically arranged relative to the centre of the fixation means.

In a constructive simple embodiment the rotation coupling means comprise an arm of which one end is rotatably connected to the frame and the other end is solidly connected to the clamp and wherein the yoke comprises a part slidably connected to the arm.

Although other means of temporary fixation are not excluded, it is preferred when the securing means for fixation of the substrate, comprise a carrier provided of switchable vacuum securing means.

Preferably the carrier is moveable in substantial horizontal direction on a rail. This feature allows to transport the substrate with the liquid from a station wherein the liquid is applied to the substrate to the apparatus according to the invention and to transport the substrate with the cured liquid away for further processing.

In another constructive simple embodiment the radiation source is formed by a LED mounted on the yoke. The mounting on the yoke, makes the distance between the radiation source and the liquid to be cured small, allowing to use a small radiation source such as a LED.

Of course the apparatus may accept substrates already provided with a layer of liquid to be cured. It is however preferred when the apparatus comprises an applicator for application of the layer of liquid on the substrate.

To allow an easy exchange of moulds it is preferred that the clamps each comprise a pair of jaws mutually moveable between an active and an inactive position and a spring adapted to urge the jaws to towards one another in the active position, both jaws being adapted to pinch opposite strips of the mould.

In many cases the flexibility of the mould combined with the ability to contain a relief, can be obtained with materials possibly having the structure of a gel, making it troublesome to be securely gripped. To allow a sure gripping of opposite ends of the mould, it is preferred when at least one of the jaws on its pinching surface comprises an friction layer, such as a layer of sanding paper. Silicone is a good example of a material to be used for the mould, although other materials, such as other polymers, are not excluded.

BRIEF DESCRIPTION OF THE DRAWINGS

Subsequently the present invention will be elucidated with the help of the following drawings, wherein depict.

DETAILED DESCRIPTION OF ILLUSTRATIVE EMBODIMENTS

The present invention relates to the application of a relief layer on a substrate such as a plastic card, like a credit card. The method according to the invention comprises—assuming the presence of a card with a layer of curable liquid—the application of a mould on the liquid, wherein the mould has a relief which is the negative of the relief to be applied to the layer. The invention provides the gradual bringing into contact of the mould with the layer avoiding the inclusion of air between the mould and the liquid. After the mould has been brought into contact with the liquid, the liquid is cured by radiation. The gradual contact between the mould and the liquid requires a flexible or bendable mould. This mould is initially brought into contact with the liquid on the substrate in a single line, and FIG. 1 depicts a first embodiment in cross section.

Figure 1A:
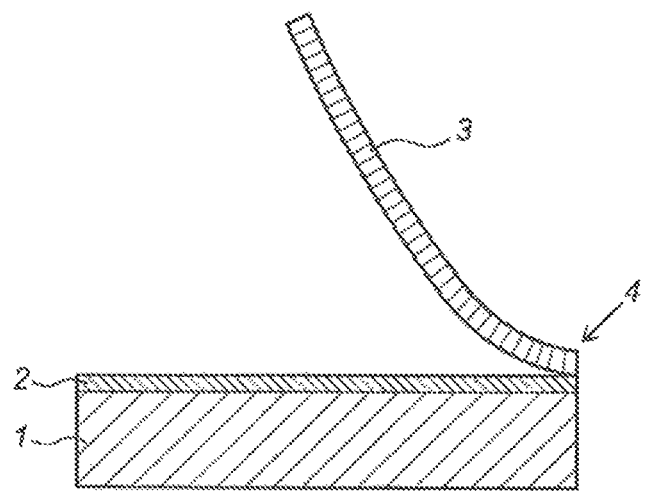
FIGS. 1A-1C: cross sectional diagrams depicting three phases in the process of applying the mould to the liquid layer according to a first embodiment.
Figure 1B:
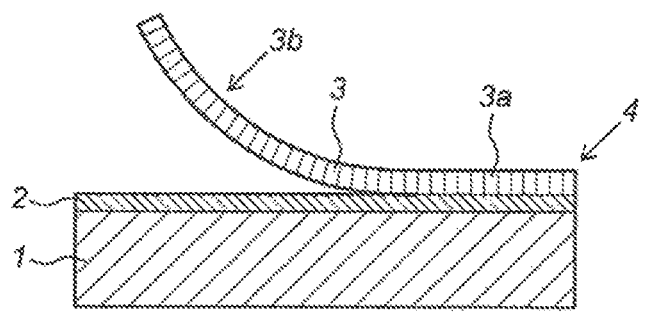
Figure 1C:
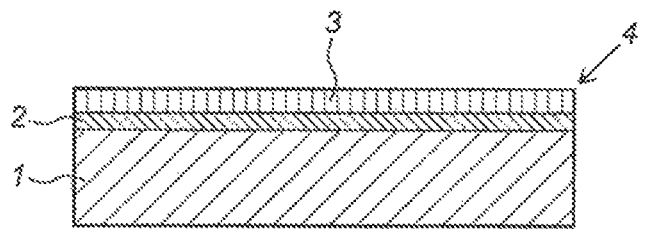

FIGS. 1A-C depict a card 1, acting as a substrate onto which a thin layer 2 of curable liquid has been provided. In FIG. 1A an edge 4 of a mould 3 is brought into contact with the liquid layer 2. This figure shows that the part of the mould 3 in contact with the liquid extends substantially parallel to the surface of the liquid as a preparation for the next step. In FIG. 1B roughly half of the surface of the liquid layer 2 is covered by the mould 3. Again the part 3a of the mould 3 in contact with the liquid layer 2 extends parallel to the surface of said layer. Due to the flexibility of the mould, the angle of the part 3b of the mould not in contact with the liquid 2 with the horizontal increases gradually from zero, as caused by the flexibility of the mould 3. In the final situation, depicted in FIG. 1C, the complete mould 3 extends parallel to the surface of the liquid layer 2. It is however also possible that only the part of the mould extending parallel to the substrate is flat and that the part of the mould not in contact with the substrate is curved, but the tangent to the curve at the border of the substrate is parallel to the substrate.

It can be seen in a comparison from FIGS. 1A and 1B that the end of the mould being lowered does not only follow a vertical downward movement but that at the same time the end moves horizontally outwards. Thus, the profile of the mould can keep the same catenary and thus the conditions at the line of contact are the same during the whole process of lowering the mould.

In the embodiment discussed above, it is assumed that the substrate is substantially rectangular, and that the initial contact line between the edge 4 of the mould coincides with an edge of the liquid layer on the substrate. It is however also possible that the substrate 1 has another, non-rectangular shape and or that the initial contact line is formed by a single point on a corner of the substrate 1.

Figure 2A:
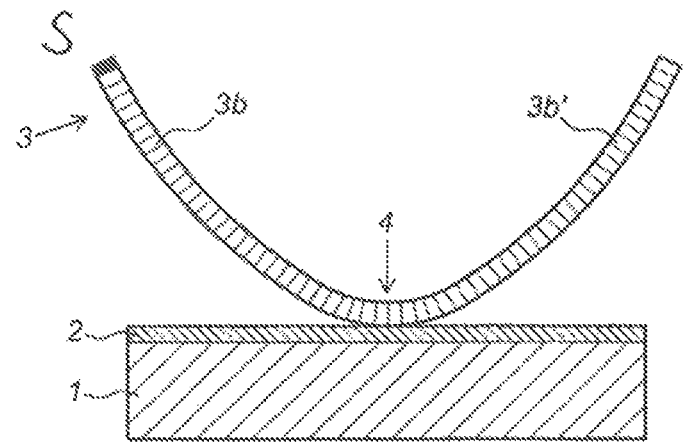
FIGS. 2A-2C: diagrams depicting three phases in the process of applying the mould to the liquid layer according to a second, alternative embodiment.
Figure 2B:
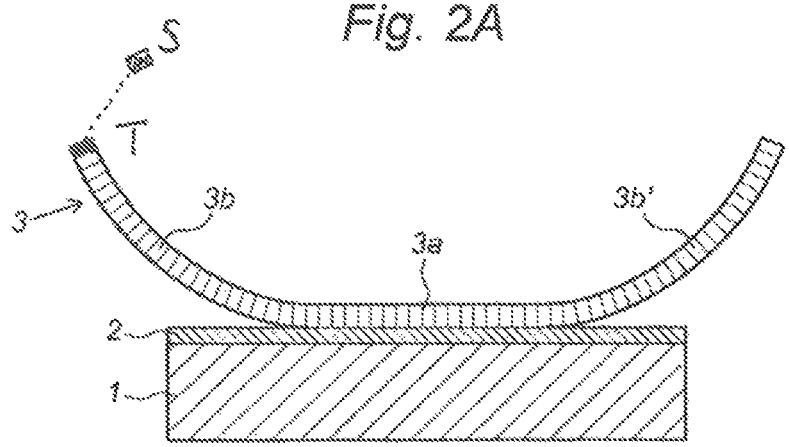
Figure 2C:
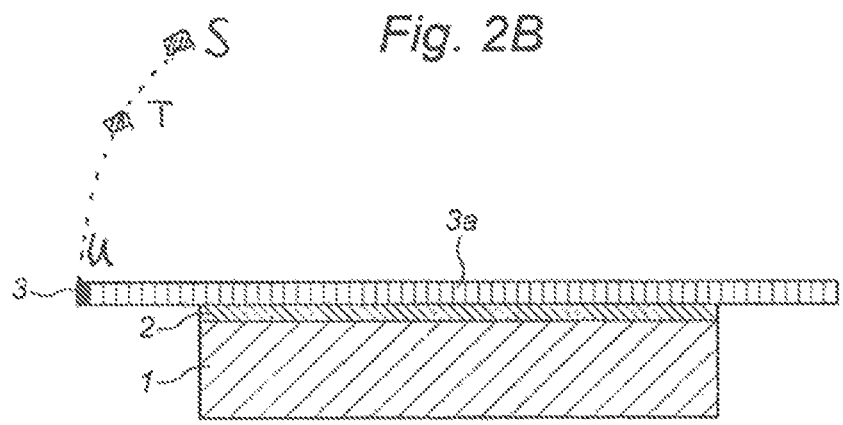

Another possibility is represented in FIG. 2. Herein the middle of the flexible mould 3 is initially brought into contact with a line 4 traversing the surface area of the liquid layer 2. This situation is represented in FIG. 2A. This embodiment is preferably although not necessarily symmetrical. The process of bringing the mould 3 into contact with the liquid layer 2 is substantially equivalent to that described with the help of the FIG. 1, although performed at both sides of the initial contact line. Again the parts 3b, 3b' respectively not being in contact with the liquid layer extend under an increasing angle with the horizontal. Comparing FIGS. 2A and 2C one can see the curve that the extreme of the left part of the mould 3b describes. In FIG. 2A this extreme point of the part of the mould 3b is at point S. When lowering the mould onto the surface, this extreme point travels to point T as shown in FIG. 2B. By this guidance, the profile of the mould not being in contact with the surface keeps the form of a catenary like the catenary of the mould in FIG. 2A. Following through until the final position as shown in FIG. 2C, the extreme point is in position U. Here, the mould is parallel to the surface of the liquid layer 2. In FIG. 2C the whole curve from points S to U via T can be seen and this curve of the extreme point of the mould allows for the mould not being in contact with the surface to keep the profile of a catenary with the same parameters than the catenary of the free hanging mould. When the edges of the mould 3 are lowered, the surface area of the part 3a of the mould 3 being into contact with the liquid layer 2 increases, as is represented in FIG. 3b. This process is continued until the full surface area of the liquid layer 2 is covered by the mould 3, as is represented in FIG. 2C.

Figure 3:
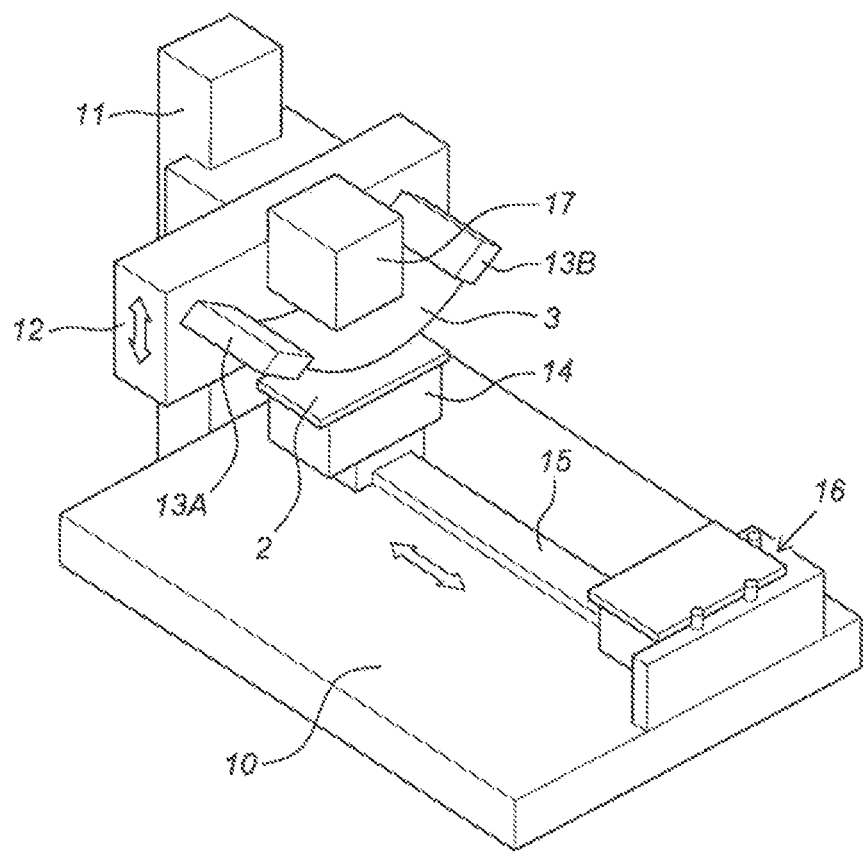
FIG. 3: a diagrammatic perspective view of an apparatus adapted to perform a method according to the second embodiment.

The above two figures only relate to the actual process. An apparatus is required to allow the process to be performed. FIG. 3 depicts an embodiment of such an apparatus. This apparatus comprises a base plate 10 onto which a column 11 is solidly connected. The base plate 10 and the column 11 together form a frame. On the column 11 a yoke 12 is slidably connected, to drive the yoke in the vertical direction drive means not depicted in the drawing, comprising and electric motor, and possibly a rack and pinion system may be provided. The yoke 12 comprises two clamps 13A, 13B connected symmetrically to the yoke 12. The clamps 13 are adapted to clamp the two opposite edges of the flexible mould 3. Under the position between the clamps a support 14 is provided for supporting and fixating the substrate to be provided of a relief layer. This support may be firmly connected to the base plate 10, but in the embodiment depicted, it is slidably connected to a rail 15, allowing the support to be transferred between the position under the mould 3 and a second position 16 in which the substrate may be provided with the liquid layer or in which the substrate may be provided complete with a liquid layer. Further, the substrate 2, complete with the cured layer 3 can be removed from said second position 16, to allow further processing. Finally a LED 17 functioning as a radiation source is provided on the yoke 12. The Led 17 may however also be located in another position adapted to let the radiation emitted by the LED to reach the liquid layer to be cured.

The connection between the clamps 13 and the yoke 12 can be embodied in different ways. The connection may be fixed, so that the clamps 13 are fixed to the yoke 12. This embodiment is only applicable if the mould 3 is substantially longer than the length of the substrate 2, to allow the flexibility of the mould 3 to cater for the variations in shape of the mould 3, such as the rate of sagging.

It is however preferred that the clamps 13 are connected slidably with a horizontal component to the yoke 12 to allow variation of the distance between the clamps 13. This variation caters for the decreasing rate of sagging of the mould 2 when the yoke 12 is lowered and the contact surface area between the mould 3 and the liquid layer 2 increases. The horizontal movement of the clamps 13 is preferably coupled to the vertical movement of the yoke 12.

It is also preferred to connect the clamps 13 rotatably to the yoke 12, possibly in combination with the slidable connection between the clamps 13 and the yoke 12. This feature allows to cater for the decreasing angle at the clamps 13 between the mould 3 and the horizontal when the mould 12 covers an increasing area of the fluid layer 2. It is possible to have the clamps 13 freely rotatable, but it is preferred that the rotation of the clamps 13 is preferably coupled to the vertical movement of the yoke 12.

FIGS. 4A-4E show several different embodiments of the connection between the clamps and the yoke. It is noted that only a half of a yoke 12 is depicted in drawing. In the embodiment depicted in FIG. 4A a carriage 18 has been slidably mounted to the yoke 12 and the clamp 13 is rotatably connected to the carriage 18 by a shaft 19, thus allowing for both translation and rotation of the clamp 13. In the shaft 19 a through going slot 20 has been provided and a curved leaf spring 21 fixed to the column extends through the slot 20. The vertical movement of the yoke 12 relative to the column 11 results in a relative movement of the shaft 19 relative to the leaf spring 21 and the curved shape of the leaf spring 21 results in both rotation and translation of the shaft 19 and the clamp 13 connected to the shaft 19. Your attention is drawn to the fact that only one half of the apparatus is depicted in this figure and that the complete apparatus comprises a second mirrored half. Further it is possible that the complete apparatus comprises a single leaf spring 21 with double length extending to both sides of the column 11.

Figure 4A:
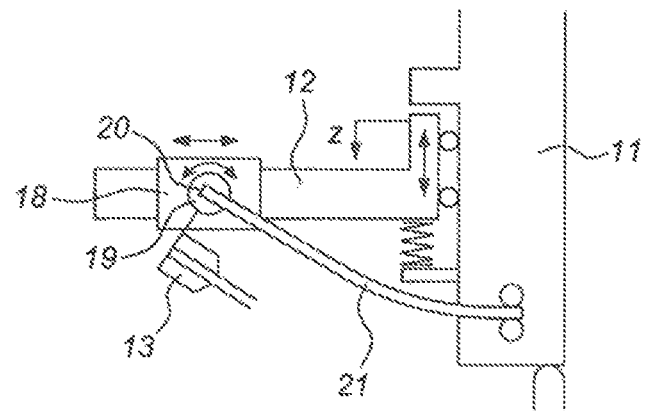
FIGS. 4A-4E: diagrams showing different constructional possibilities of the second embodiment.
Figure 4B:
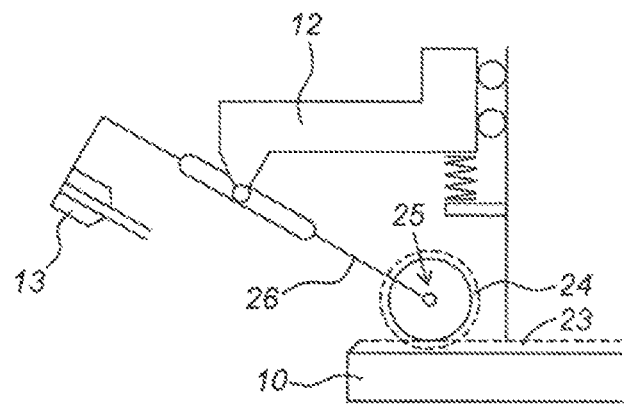

The embodiment depicted in FIG. 4B comprises a rack rail 23 extending over the base plate 10 and a gear 24 of which the teeth engage the rack rail 23. A first end of an arm 26 is rigidly connected with the gear 24, so that the rotation of the arm 26 causes rotation of the gear 24 and, as caused by the rack rail 23, translation of the gear 24 and of the first end of the arm 26. A slot 25 is located in the arm and a pin 25A is connected to the yoke 12 and extends through the slot 25. The clamp 13 is fixed to the second end of the arm 26. Vertical movement of the yoke 12 results in both a rotation and translation of the arm 26 relative to the base. This results in an involute movement of the clamp 13.

Figure 4C:
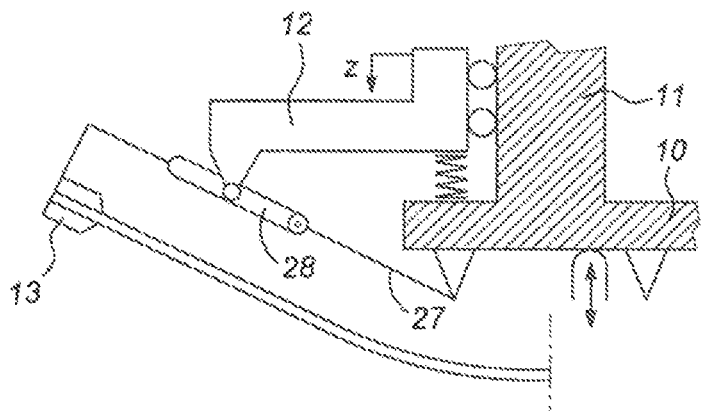

A simpler embodiment is depicted in FIG. 4C; one end of an arm 27 is rotatably connected to the base plate 10 or the column 11. A slot 28 is provided in the arm 27 and a pin 29 connected to the yoke 12 extends into the slot 28, allowing relative translation and rotation of the arm 27 relative to the yoke 12. The clamp 13 is fixed to the second end of the arm 27. Vertical movement of the yoke 12 results in both rotation of the arm 27, wherein the second end of the arm and hence the clamp 13 describes a rotation and a translation.

Figure 4D:
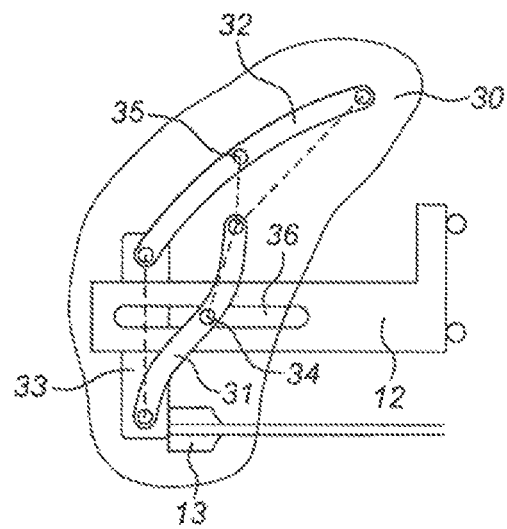

An embodiment allowing more freedom in design is depicted in FIG. 4D. This embodiment comprises a plate 30 extending in vertical direction perpendicular to the rail 15 and wherein two slots 31, 32 have been provided. The slots 31, 32 have a curved shape and they both extend with a horizontal and a vertical component. A carriage 33 is attached to the clamp 13 and two pins 34, 35 extend from the carriage 33 through the slots 31, 32. The shape of the slots 31, 32 determine the path of the carriage 33 and of the clamp 13. One of the pins 34 extends also into a horizontal slot 36 provided in the yoke 12. Vertical movement of the yoke 12 results in vertical movement of the pin 34. As the pin 34 also extends through the slot 31 which has a horizontal component, the pin 34 also moves in horizontal direction, also moving the other pin 35, of which the movement is determined by the other slot 32. Now that the path of the movement of the both pins 34, 35 is determined, the path of the carriage 33 and the clamp 13 connected thereto is determined, both in translation and rotation.

Figure 4E:
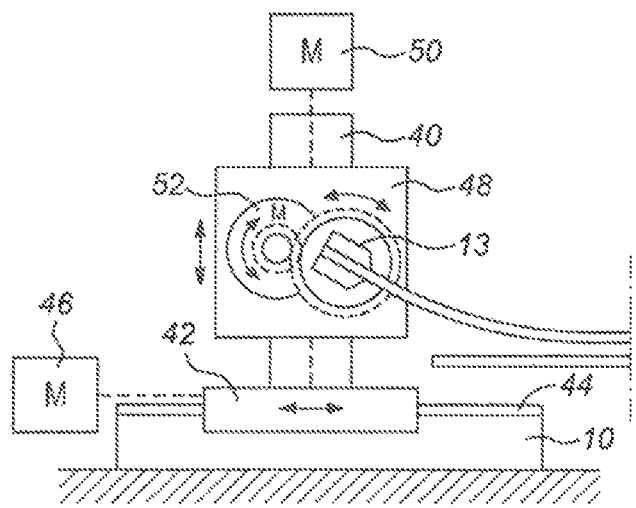

Finally FIG. 4E shows an embodiment wherein both the translation and the rotation of the clamp can be freely determined. Contrary to the embodiments discussed hitherto, each comprising one column 11 this embodiment comprises two columns 40, 41, one for each of the clamps 13 and only one of the columns 40 is depicted. The column 40 is mounted on a carriage 42, which is movable over a rail 44 mounted on the base plate. A controllable motor 46 is provided to drive the carriage over the rail 44. A yoke 48 is mounted movable in vertical direction over the column 40 and a controllable motor 50 is provided to drive the yoke 48 over the column 40. The clamp 13 is mounted rotatable relative to the yoke 48, and a controllable motor 52 is provided to drive the clamp 13. It will be clear that a similar, preferably mirrored structure is present to control the other clamp 13. By controlling the motors 46, 50 and 52, the position in two directions and the angle of the clamp is controllable.

Figure 5:
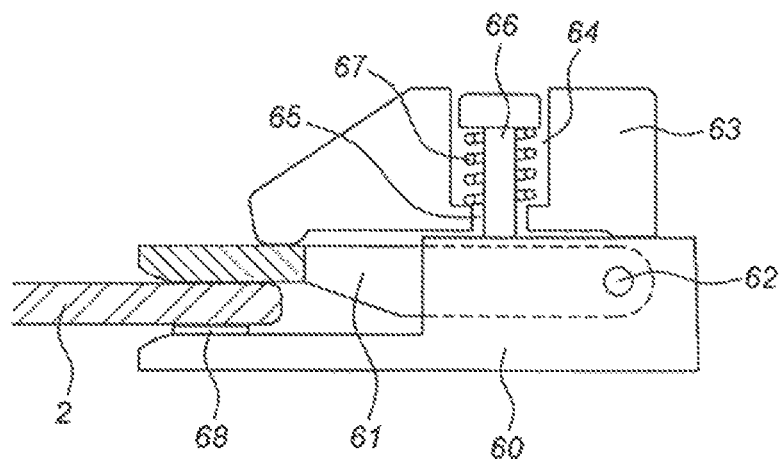
FIG. 5: a cross section view of a clamp to be used in the apparatus according to the invention.

An embodiment of the clamps is shown in FIG. 5. As stated before the mould 3 has to be flexible, and at the same time to have a certain thickness to contain a counter relief, making the clamping of such a mould 3 cumbersome. The embodiment of the clamp 13 depicted in FIG. 5 comprises a fixed part 60 and a moveable part 61 connected to the fixed part 60 by a shaft 62, allowing the moveable part 61 to move relative to the fixed part 60. On the moveable part 61 a pressing member 63 has been mounted, into which a cavity 64 has been provided. The cavity comprises a continuation 65 having a smaller diameter and extending through the moveable part 61. A screw 66 extends through the cavity 64 and its continuation 65 and it is screwed into the fixed part of the clamp 13. A helical spring 67 is pressed between the bottom of the cavity and the head of the screw 66, pressing the pressing member 63 and hence the moveable part 61 of the clamp to the fixed part thereof, thus providing a controllable pressing force for pressing the mould 3 between the two parts 60, 61 of the clamp. To increase the friction between the clamp 13 and the mould 2, a piece of sanding paper 68 is glued to the fixed part 60 of the clamp 13. However other friction materials may be used as well.

Figure 6:
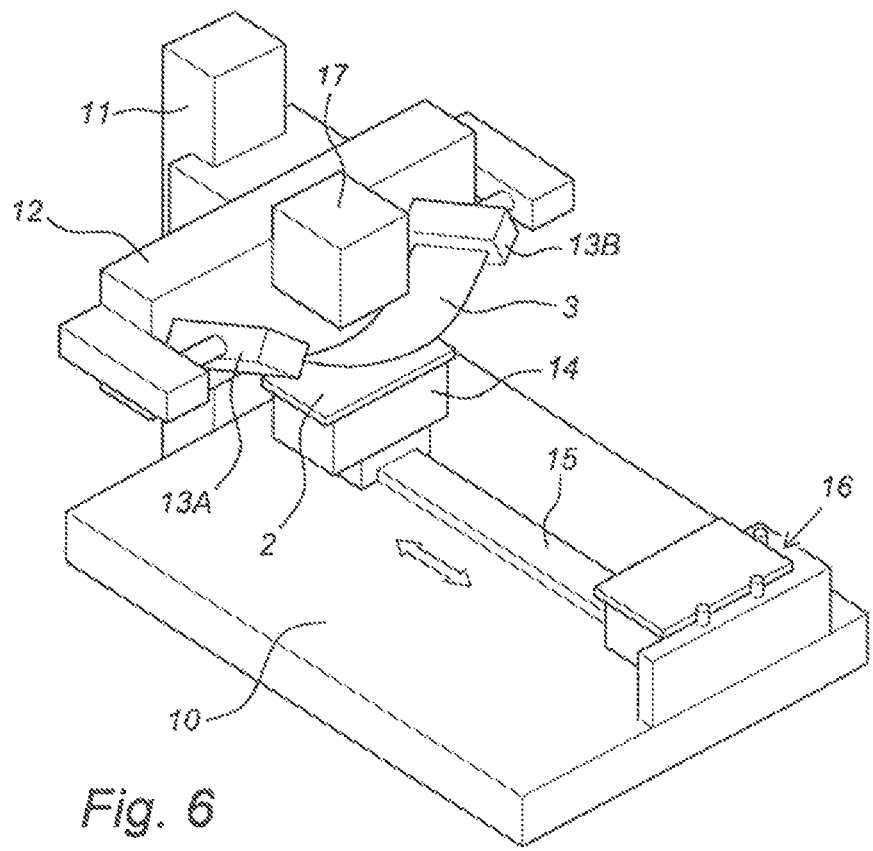
FIG. 6: a view similar to FIG. 3, depicting an alternative embodiment.

FIG. 6 depicts an apparatus similar to that depicted in FIG. 3, but wherein the connection between the clamps 13 to the yoke 12 has been modified to allow rotation or tilt of the clamps 13 around an axis extending in the longitudinal direction of the mould 3. As the mould 3 extends between the clamps, the axis extends between the centres of the clamps 13. To control the tilt, two electric motors 70 are connected to the ends of the yoke 12 and a shaft 71 extends from each of the motors 70 to the clamps 13. The clamps 13 are fixed to the shafts 71. The motors 70 are controlled such that the motors rotate simultaneously. Tilting of the clamps 13 makes the mould 3 tilt such that, when the assembly of the yoke 12, the motors 70, the clamps 13 and the mould 3 lowers, the mould 3 initially touches the substrate 1, or rather the liquid layer 2 on the substrate 1 in a point, rather than over a line, as is the case in the situation depicted in FIG. 3. When the assembly is lowered further, the initial tilt of the mould 3 is to be reversed, preferably simultaneously with the lowering of the mould 3, to allow the mould to extend over the full surface area of the liquid layer 2 of the substrate 1.

Especially, though not exclusively, it appears to be attractive to apply the kinematic variations mentioned before in this embodiment, for instance by providing a lift for the block carrying the substrate.

The above description elucidates some embodiments of the invention, but the invention is not restricted to these embodiments, of which different features may be combined; rather the scope of the invention is determined by the claims.

Although the present invention has been described with reference to preferred embodiments, workers skilled in the art will recognize that changes may be made in form and detail without departing from the spirit and scope of the invention.

The invention claimed is:

1. A method for applying a layer having a relief on a flat surface of a substrate, the method comprising:
    applying a layer of a curable liquid on an upper surface of the substrate;
    bringing a mould having a relief, being the negative of the relief to be provided on the substrate, into contact with at least a part of the curable liquid layer;
    curing the curable liquid layer while the mould is in contact with the curable liquid layer; and
    separating the mould from the substrate;
    wherein the mould is operably connected to a yoke by a first and second clamp, and at least one of the first or second clamps is at least one of rotatably or translatably connected to the yoke such that movement of the yoke toward the substrate to bring the mould into contact with the at least part of the curable liquid layer causes at least one of:
        rotation of such clamp; or
        translation of such clamp in a direction perpendicular to the movement of the yoke; and
    wherein by operation of the yoke and first and second clamps, the mould is initially brought into contact with the curable liquid layer in a catenary position and as the yoke is moved closer toward the substrate, the mould is flattened over an increasing surface area of the curable liquid layer.

2. The method as claimed in claim 1, wherein the mould is initially brought into contact with the curable liquid layer on the substrate along a line.

3. The method as claimed in claim 1, wherein the mould is initially brought into contact with the curable liquid layer on the substrate substantially at a point.

4. The method as claimed in claim 1, wherein the mould is flattened over an increasing surface area of the curable liquid layer in a single direction.

5. The method as claimed in claim 1, wherein the mould is flattened over an increasing surface area of the curable liquid layer in two opposite directions.

6. The method as claimed in claim 1, wherein the curable liquid layer applied is substantially transparent for curing radiation when liquid and transparent for visible light when cured.

7. An apparatus for applying a layer having a relief on a flat surface of a substrate, the apparatus comprising:
    a frame;
    fixation means connected to the frame and adapted to fixate the substrate;
    a mould carrying a counter relief;
    a yoke operably connected with the frame and moveable in a direction relative the frame toward the fixation means;
    a first and second clamp operably connecting the mould to the yoke, at least one of the first or second clamps being at least one of rotatably or translatably connected to the yoke such that movement of the yoke toward the fixation means causes at least one of:
        rotation of such clamp; or
        translation of such clamp in a direction perpendicular to the movement of the yoke; and
    a radiation source adapted to emit radiation curing a liquid applied in a layer on the flat surface of the substrate.

8. The apparatus as claimed in claim 7, wherein the mould is substantially transparent for radiation emitted by the radiation source.

9. The apparatus as claimed in claim 7, wherein the first and second clamps are adapted to grip opposite sides of the mould and the apparatus further comprises driving means for driving the movement of the yoke.

10. The apparatus as claimed in claim 9, wherein the clamps are arranged symmetrically relative to the centre of the fixation means.

11. The apparatus as claimed in claim 7, further comprising an arm of which one end is moveably connected to the frame and the other end is fixedly connected to one of the first or second clamps and the yoke comprises a part slidably connected to the arm.

12. The apparatus as claimed in claim 7, wherein the fixation means comprise a block provided with switchable vacuum fixation means.

13. The apparatus as claimed in claim 12, wherein the block is moveable relative the frame on a rail.

14. The apparatus as claimed in claim 7, wherein the radiation source comprises a LED mounted on the yoke.

15. The apparatus as claimed in claim 7, wherein the apparatus comprises an applicator for application of the layer of liquid on the substrate.

16. The apparatus as claimed in claim 7, wherein the first and second clamps each comprise a pair of jaws mutually moveable between an active and an inactive position and a spring adapted to urge the jaws towards one another in the active position.

17. The apparatus as claimed in claim 16, wherein at least one of the jaws of the pair of jaws for each of the first and second claims comprises a pinching surface having a friction layer.

18. The apparatus as claimed in claim 7, wherein the yoke and first and second clamps are operable to initially bring the mould into contact with the liquid layer in a catenary position and as the yoke is moved closer toward the fixation means, the mould is flattened over an increasing surface area of the liquid layer.

19. The apparatus as claimed in claim 7, wherein at least one of the first or second clamps is rotatably and translatably connected to the yoke such that movement of the yoke toward the fixation means causes both:

rotation of such clamp; and translation of such clamp in a direction perpendicular to the movement of the yoke.

20. The apparatus as claimed in claim 19, wherein both the first and second clamps are rotatably and translatably connected to the yoke such that movement of the yoke toward the fixation means causes:

rotation of the first and second clamps; and translation of the first and second clamps in a direction perpendicular to the movement of the yoke.

* * * * *